United States Patent
Gui et al.

(10) Patent No.: US 8,115,093 B2
(45) Date of Patent: Feb. 14, 2012

(54) LAYER-TO-LAYER INTERCONNECTS FOR PHOTOELECTRIC DEVICES AND METHODS OF FABRICATING THE SAME

(75) Inventors: John Yupeng Gui, Niskayuna, NY (US); Eladio Clemente Delgado, Burnt Hills, NY (US)

(73) Assignee: General Electric Company, Schenectady, NY (US)

( * ) Notice: Subject to any disclaimer, the term of this patent is extended or adjusted under 35 U.S.C. 154(b) by 2156 days.

(21) Appl. No.: 11/058,850

(22) Filed: Feb. 15, 2005

(65) Prior Publication Data

US 2006/0180197 A1 Aug. 17, 2006

(51) Int. Cl.
- *H01L 25/00* (2006.01)
- *H01L 31/00* (2006.01)
- *H01L 31/042* (2006.01)

(52) U.S. Cl. ......................................... 136/243; 136/249
(58) Field of Classification Search ................... 136/243, 136/249
See application file for complete search history.

(56) References Cited

U.S. PATENT DOCUMENTS

| | | | |
|---|---|---|---|
| 5,508,569 A * | 4/1996 | Nishino | 307/150 |
| 6,198,092 B1 * | 3/2001 | Bulovic et al. | 250/214.1 |
| 6,740,807 B2 * | 5/2004 | Ono | 136/263 |
| 2003/0129829 A1 | 7/2003 | Greenlaw | 438/637 |
| 2004/0211458 A1 | 10/2004 | Gui | 136/244 |

OTHER PUBLICATIONS

The American Heritage Science Dictionary, Houghton Mifflin Company, definition of electrolyte, Jul. 9, 2008.*

* cited by examiner

*Primary Examiner* — Alexa Neckel
*Assistant Examiner* — Shannon Gardner
(74) *Attorney, Agent, or Firm* — Fletcher Yoder

(57) ABSTRACT

Interconnects for electronic devices. More specifically, stacked photoelectric devices, such as parallel tandem photovoltaic devices are provided. Each of the photovoltaic devices comprises photovoltaic cells formed between two substrates. Each of the substrates may include one or more interconnects to route a voltage from one side of the substrate to another. Each substrate includes an edge portion extending beyond the edge portion of an immediately adjacent substrate. All interconnects are exposed to one side of the device for easy and flexible electric connectivity and fabrication. The interconnects, which may include conductive vias or conductive edge wraps, are formed in the edge portion of the substrates.

18 Claims, 5 Drawing Sheets

LAYER-TO-LAYER INTERCONNECTS FOR PHOTOELECTRIC DEVICES AND METHODS OF FABRICATING THE SAME

BACKGROUND OF THE INVENTION

A photovoltaic (PV) cell is generally an electronic device that is capable of converting incident light into electricity (direct current). A photovoltaic cell comprises a pair of electrodes and light-absorbing and charge transporting photovoltaic materials disposed therebetween. When the photovoltaic material is irradiated with light, electrons that have been confined to an atom in the photovoltaic material are released by light energy to move freely. Thus, free electrons and holes are generated. The free electrons and holes are efficiently separated and transported to the electrodes through charge transporting materials so that electric energy is continuously extracted. Current commercial photovoltaic cells use a semiconductor photovoltaic material, typically silicon. However, implementing silicon for photovoltaic cells generally requires high product cost due to extensive material and energy consumption. Another type of commercial PV cell that has lower material consumption are thin film PV cells such as a-Si, CaTe, CIGS, etc. However, these thin film PV cells generally require a high vacuum manufacturing process, which generally leads to high capital investment and operational expenses.

One alternative type of PV cell that has low cost potential is an organic or/and organic/inorganic hybrid cell. Among this class of PV cells, dye sensitized solar cells (DSSCs) may be the most promising for commercialization based on currently available experimental results. The DSSC has three major active materials: a dye, an electron transporter material (such as titanium dioxide) and a hole transporter material (such as electrolyte). The dye is generally used, because titanium dioxide ($TiO_2$) alone absorbs little photon energy from sunlight. To sensitize the titanium dioxide, a dye (or chromophore) is coupled onto the surfaces of the semiconductor solid (e.g. titanium dioxide). When a dye molecule absorbs a photon, electrons are excited into the lowest unoccupied molecular orbital, from which they are injected into the conduction band of the semiconductor (e.g., titanium dioxide). Once in the conduction band, the electrons can then flow through a first electrode (also known as the front electrode, anode or photoelectrode). Thus, the semiconductor serves as a transport medium for electrons. Hole transport between the dye layer and the second electrode (also known as the back electrode, cathode or counter electrode) occurs through an electrolyte solution disposed between the electrodes. Practically, the returning electrons at the second electrode effect a oxidation-reduction ("redox") reaction, generating a reduced species that returns the electrons to the oxidized dye molecules, and the cycle repeats. It is desirable to provide a sensitizing agent that absorb as large a portion of the sunlight wavelength as possible to maximize the harvest of photon energy.

A solar cell is a specific type of photovoltaic cell that is configured to convert solar energy (sunlight) into electricity. A solar cell includes two electrodes, which may be referred to as the solar electrode, configured to receive sunlight, and a counter electrode. The solar electrode collects high energy electrons from the photo-generation process. The counter electrode provides low energy electrons to the active cell materials disposed between the electrodes. Solar energy has become an attractive source of energy for remote locations and is widely recognized as a clean, renewable alternative form of energy.

As will be appreciated, solar energy includes a wide range of photon energies. To achieve high efficiency, the solar cell must absorb a sufficient amount of photons from the solar energy. There are two approaches to achieve maximum solar absorption. One is to use a dye that has very broad wavelength absorption. Another approach is to use several complimentary dyes. It is very difficult to have a dye that is both strong and a broad absorber. A strong absorber enables a thinner layer cell, thus provides a higher efficiency cell as a result of the short charge transport distance. Advantageously, by stacking multiple cell modules coupled in series, improved efficiency and appearance can be realized. Since each cell module in the stack may be configured to absorb a specific range of solar energy, it is possible to convert more photon energy to electric energy. Furthermore, the stacked configuration provides a more aesthetically pleasing device appearance.

Typically, in order for tandem cells, such as inorganic thin film cells, to achieve a high efficiency, great efforts are made so that each cell in series has the same or similar current. Otherwise, the device current will be limited to the smallest cell current. Light losses throughout the photovoltaic device, cost, material and processing limitations and interconnection among various elements in the photovoltaic device present a number of challenges in designing viable, useful, efficient, manufacturable and reliable photovoltaic devices. In contrast, organic or hybrid PV cells, can be fabricated at a comparatively low cost. Thus a new type tandem device can be made through a parallel tandem architecture where several layers of PV cells are stacked optically in series and electrically in parallel. One major advantage of this parallel tandem device architecture is that there is no requirement for current matching at each layer of the device. Furthermore, this architecture provides practical means for providing a variety of color appearances, because different layers of cells can be independently stacked. The flexibility of this architecture design requires unique ways for simple and low cost interconnects to match current or voltage for the integration of each of the layers of cells which make up the stacked device.

BRIEF DESCRIPTION OF THE INVENTION

In accordance with one exemplary embodiment of the present invention, there is provide a photovoltaic device comprising: a plurality of substrates arranged in a stack; one or more photovoltaic cells formed between each of the plurality of substrates; and wherein each of the plurality of substrates comprises a plurality of interconnects configured to provide voltage on each side of each of the plurality of substrates.

In accordance with another exemplary embodiment of the present invention, there is provide an electronic device comprising: a plurality of flexible substrates arranged in a stack and having interconnects, wherein each of the interconnects is configured to derive one of a plurality of voltages on a first side of the plurality of flexible substrates and configured to distribute the one of the plurality of voltages to a respective second side of the plurality of flexible substrates; and a plurality of electronic cells disposed between each of the plurality of flexible substrates.

In accordance with yet another exemplary embodiment of the present invention, there is provide a photovoltaic device comprising: an upper substrate having a top surface and a bottom surface and having a first plurality of active elements disposed on the bottom surface of the upper substrate; a lower substrate having a top surface and a bottom surface and having a second plurality of active elements disposed on the top surface of the lower substrate; and at least one intermediate substrate disposed between the upper and lower substrate and having a top surface and a bottom surface, wherein a third plurality of active elements are disposed on the top surface of the at least one intermediate substrate and a forth plurality of active elements are disposed on the bottom surface of the at least one intermediate substrate, and wherein the at least one intermediate substrate comprises a plurality of interconnects configured to distribute a voltage from the top surface to the bottom surface of the at least one intermediate substrate.

In accordance with still another exemplary embodiment of the present invention, there is provide a method of operating a photovoltaic device comprising: obtaining a first voltage between a lower surface of a first substrate and a lower surface of a second substrate, wherein a first plurality of photovoltaic cells are formed between the first and second substrates; routing the first obtained voltage contacts through a first interconnect from the lower surface of the second substrate to an upper surface of the second substrate, such that the first voltage is derived from each of the first plurality of photovoltaic cells; obtaining a second voltage between the lower surface of the second substrate and a lower surface of a third substrate, wherein a second plurality of photovoltaic cells are formed between the second and third substrates; and routing the second obtained voltage contacts through a second interconnect from the lower surface of the third substrate to an upper surface of the third substrate, such that the second voltage is derived from each of the first plurality of photovoltaic cells.

In accordance with a further exemplary embodiment of the present invention, there is provide a method of fabricating a photoelectric device comprising: stacking a plurality of cell modules, wherein each of the plurality of cell modules comprises a plurality of solar cells; measuring an electrical performance of each of the plurality of solar cells; and interconnecting each of the plurality of cell modules based at least partially on the electrical performance of each of the plurality of solar cells, such that each of the plurality of cell modules comprises approximately the same current or voltage output.

DETAILED DESCRIPTION OF SPECIFIC EMBODIMENTS

Figure 1:
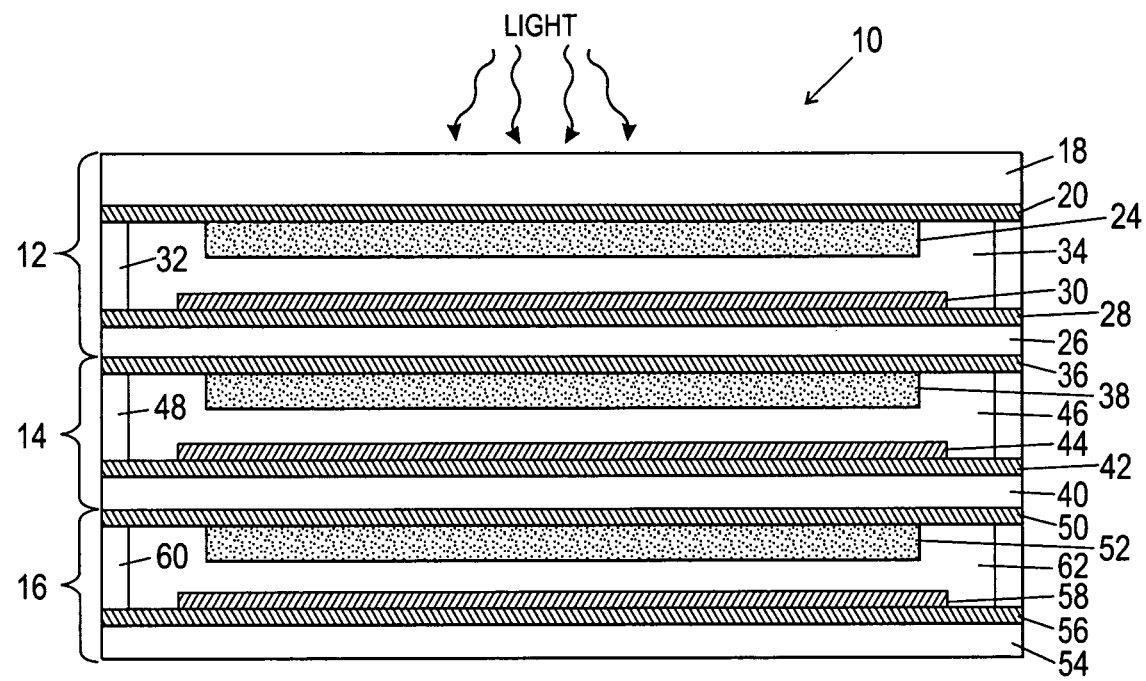
FIG. 1 is a cross-sectional view of a photovoltaic device having a stacked configuration, in accordance with embodiments of the present techniques.

Organic electronic devices, such as photovoltaic (PV) devices, may be fabricated by depositing materials on substrates and laminating the substrates together to form a one or more solar cells stacked on top of each other. FIG. 1 illustrates a PV device 10 of the first embodiment of the present invention that comprises a plurality of PV modules 12, 14 and 16 arranged in a stack. Although the PV device 10 of FIG. 1 illustrates only three PV modules 12, 14 and 16, it should be understood that any desirable number of PV modules may be implemented in accordance with the present techniques. In addition, although FIG. 1 shows only one PV cell for each PV cell module, a PV cell module of the present invention can comprise a plurality of PV cells arranged in a grid pattern, as will be disclosed further below with reference to FIG. 3. Further, while the exemplary embodiment of FIG. 1 illustrates a dye sensitized PV cell, it should be understood that other types of PV cells may also be implemented in accordance with the present techniques. Still further, the techniques described herein may be applicable to other organic electronic devices, such as electroluminescent devices.

FIG. 1 illustrates the concept of a tandem device incorporating a conventional liquid type of dye sensitized solar cell, as the example. The first PV cell module 12 comprises a first substrate 18. The first substrate 18 comprises a flexible and substantially transparent film. The flexible substrate 18 generally comprises a substantially transparent film. As used herein, "substantially transparent" refers to a material allowing a total transmission of at least about 50%, preferably at least about 80%, of solar light (i.e., having a wave length in the range from about 400 nm to about 1100 nm). The flexible substrate 18 is generally thin, having a thickness in the range of approximately 0.25-50.0 mils, and preferably in the range of approximately 0.5-3.0 mils. The term "flexible" generally means being capable of being bent into a shape having a radius of curvature of less than approximately 100 cm.

The flexible substrate 18 may be dispensed from a roll, for example. Advantageously, implementing a roll of transparent film for the flexible substrate 18 enables the use of high-volume, low cost, reel-to-reel processing and fabrication of the PV device 10. The roll of transparent film may have a width of 1 foot, for example, on which a number of organic packages may be fabricated and excised. The flexible substrate 18 may comprise a single layer or may comprise a structure having a plurality of adjacent layers of different materials. The flexible substrate 18 has an index of refraction in the range of approximately 1.05-2.5, and preferably in the range of approximately 1.1-1.6. Further, the flexible substrate 18 generally comprises any flexibly suitable polymeric material. For instance, the flexible substrate 12 may comprise polycarbonates, polyarylates, polyetherimides, polyethersulfones, polyimides, such as Kapton H or Kapton E (made by Dupont) or Upilex (made by UBE Industries, Ltd.), polynorbornenes, such as cyclic-olefins (COC), liquid crystal polymers (LCP), such as polyetheretherketone (PEEK), polyethylene terephthalate (PET), and polyethylene naphtalate (PEN). Alternatively, the flexible substrate 18 may be a thin film glass with polymer enforced backing.

A conductive coating 20 comprising a substantially transparent, electrically conductive material may be disposed on the substrate 18 to provide the first electrode for the PV cell module 12. Suitable materials that can be used for the conductive coating 20 are substantially transparent, electrically conductive oxides, such as indium tin oxide (ITO), F-doped tin oxide (FTO), tin oxide, indium oxide, zinc oxide, indium zinc oxide, zinc indium tin oxide, antimony oxide, and mixtures thereof A thin, substantially transparent layer of metal is also suitable. Such a metal layer typically has a thickness of less than 100 nm. Suitable metals are silver, gold, aluminum, copper, steel, or nickel. Since the flexible substrate 18 is exposed to environmental conditions, the coating 20 may also include additional layers of barrier coating between the surface of the substrate 18 and the conductive coating 20 to avoid excess water and/or oxygen penetration.

A semiconductor layer 24 is disposed in electrical contact with the coating 20. Suitable semiconductor materials for the layer 24 include metal oxide semiconductors, such as oxides of the transition metal elements; specifically, oxides of titanium, zirconium, halfnium, strontium, zinc, indium, yttrium, lanthanum, vanadium, niobium, tantalum, chromium, molybdenum, tungsten, iron, nickel, silver or mixed oxides of these elements. Other suitable oxides are those having a perovskite structure, such as $SrTiO_3$ or $CaTiO_3$. The semiconductor material of layer 24 is coated with a photosensistizing dye. Preferably, the photosensitizing dye is chemically adsorbed on or bonded through chemical bonds to the surface of the semiconductor material. Such chemical bonds are easily formed when the photosensitizing dye has a functional group such as carboxyl, alkoxy, hydroxy, hydroxyalkyl, sulfonic, phosphonyl, ester, or mercapto groups. Non-limiting examples of photosensitizing dyes are organometallic complexes having a formula of $MX_3L_t$ or $MXYL_t$, where M is a transition metal selected from the group consisting of ruthenium, osmium, iron, rhenium, and technetium; $L_t$ is tridentate ligand comprising heterocycles such as pyridine, thiophene, imidazole, pyrazole, triazole, carrying at least one carboxylic, phosphoric, hydroxamic acid or chelating group; X is a co-ligand independently selected from the group consisting of NCS, Cl, Br, I, CN, NCO, $H_2O$, NCH, pyridine unsusbtituted or substituted with at least one group selected from the group consisting of vinyl, primary amine, secondary amine, and tertiary amine, OH, and $C_{1-30}$ alkyl; and Y is a co-ligand selected from the group consisting of o-phenanthroline, 2,2'-bipyridine unsusbtituted or substituted with at least one $C_{1-30}$ alkyl group. Other suitable photosensitizing dyes are the pure organic dyes or other organometallic dyes, such as azo dyes, quinone dyes, quinoneimine dyes, quinacridone dyes, squarylium dyes, cyanine dyes, merocyanine dyes, triphenylmethane dyes, xanthene dyes, porphyrin dyes, phthalocyanine dyes, perylene dyes, indigo dyes, and naphthalocyanine dyes.

A second substrate 26 having an electrically conductive coating 28 disposed thereon is disposed opposite and apart from the semiconductor layer 24. The electrically conductive coating 28 serves as the second electrode of the PV cell module 12, and can be made of one of the conductive oxides or of a substantially transparent layer of one of the metals listed above for the first electrode layer 20. The substrate 26 may be made of a substantially transparent and flexible polymeric material, such as one of the polymeric materials listed above. A layer 30 of a catalyst for oxidation-reduction reaction is disposed on the coating 28. Suitable catalysts for oxidation-reduction reaction are platinum and palladium, for instance. It is preferred that the catalyst metals are disposed as very fine particles having a size on the order of less than about 10 nanometers, for instance.

Seals 32 are provided around the periphery of the PV cell module 12 to define space 34, in which an electrolyte, which serves as a charge carrier for returning electrons to the oxidized dyes from an external circuit, is injected. The electrolyte comprises a species that can undergo reduction-oxidation (redox) reaction, such a combination of an iodide salt and iodine, or a bromide salt and bromine. Salts such as LiI, NaI, KI, $CaI_2$, LiBr, NaBr, KBr, or $CaBr_2$ may be used. Typically an electrolyte consists of solvent and a redox couple. High boiling point polar organic solvents or non-volatile ionic liquids may be more practical for solar cell application. Seals 32 are made of a material resistant to chemical attack by the electrolyte, such as an epoxy resin.

The substantially transparent and flexible substrate 26 also serves as the first substrate for the second PV cell module 14, and provides electrical isolation from the first PV cell module 12. The substrate 26 has a coating 36 of a substantially transparent, electrically conductive material that is selected from among the materials disclosed above with reference to the coating 20 and disposed on the second surface of the substrate 26, opposite the conductive coating 28. Thus, the PV cells of the PV cell module 14 are electrically insulated from the PV cells of the PV cell module 12. Each of the second and third PV cell modules 14 and 16 has similar components as the first PV cell module 12. The components of PV cell modules 14 and 16 comprise materials that are disclosed as suitable for the corresponding components of PV cell module 12. However, as will be appreciated, each of the PV cell modules 12, 14 and 16 may include unique materials to provide for different color and wavelength absorption, as described further below.

A semiconductor layer 38 is disposed on the coating 36. The semiconductor material of layer 38 is coated with a photoactivatable dye. The photoactivatable dye for each of PV cells in the PV cell modules 12, 14 and 16 is capable of absorbing light of a different wavelength range in the spectrum of total light received by the PV device 10 so that cells in the PV cell modules 12, 14 and 16 together absorb substantially all of the light received by the PV device 10. In other words, the spectrum of total light received by the PV device 10 comprises the wavelength ranges of light absorbed by all of the photoactivatable dyes of the cells in each of the PV cell modules 12, 14 and 16. For example, when the total light received by the PV device 10 is sunlight, the photoactivatable dyes for the PV cells in the PV cell modules 12, 14 and 16 may be chosen to have substantial absorption in the range of about 430-530 nm, 530-580 nm, 580-700 nm, respectively. In addition, one or more additional PV cells may be included in the PV device 10 and may carry photoactivatable dyes having substantial absorption in a portion of the UV range, such as 290-400 nm, or in the near infrared range, such as 700-820 nm. Since each PV cell in each PV cell module 12, 14 and 16 is manufactured to absorb light maximally in a different wavelength range, the energy conversion efficiency of the PV device 10 can be improved significantly over that of prior art devices.

A second substrate 40 having an electrically conductive coating 42 disposed on a first surface thereof is disposed opposite and apart from semiconductor layer 38. The electrically conductive coating 42 serves as the second electrode of the PV cell module 14, and can be made of one of the conductive oxides listed above or of a substantially transparent metal layer. The substrate 40 may be made of a flexible, substantially transparent polymeric material, such as one of the polymeric materials listed above. A layer 44 of a catalyst for oxidation-reduction reaction is disposed on coating 42. Suitable catalysts for oxidation-reduction reaction are platinum and palladium. The catalyst metals are disposed as very fine particles, such as having a size on the order of less than about 10 nanometers, for instance.

Seals 48 are provided around the periphery of the PV cell module 14 to define space 46, which contains an electrolyte, which serves as a charge carrier for returning electrons from an external circuit. The electrolyte comprises a species that can undergo oxidation-reduction reaction, such as a combination of an iodide salt and iodine, or a bromide salt and bromine. Salts such as LiI, NaI, KI, $CaI_2$, LiBr, NaBr, KBr, or $CaBr_2$ may be used. The seals 48 are made of a material resistant to chemical attack by the electrolyte, such as an epoxy resin.

The flexible, substantially transparent substrate 40 also serves as the first substrate for the third PV cell module 16, and provides electrical isolation from the second PV cell module 14. The substrate 40 has a coating 50 of a substantially transparent, electrically conductive material that is selected from among the materials disclosed above with reference to layers 20 and 36 and is disposed on the second surface of the substrate 40, opposite the conductive layer 42. Thus, the PV cell module 16 is electrically insulated from the PV cell module 14. A semiconductor layer 52 is disposed on the coating 50. The semiconductor material of layer 52 is coated with a photoactivatable dye.

A second substrate 54 having an electrically conductive coating 56 disposed on a first surface thereof is disposed opposite and apart from semiconductor layer 52. The electrically conductive coating 56 serves as the second electrode of PV cell module 16 and can be made of one of the conductive oxides listed above or of a substantially transparent metal layer. The substrate 54 may be made of a flexible, substantially transparent polymeric material, such as one of the polymeric materials listed above. A layer 58 of a catalyst for oxidation-reduction reaction is disposed on the coating 56. Suitable catalysts for oxidation-reduction reaction are platinum and palladium. The catalyst metals may be disposed as very fine particles having a size on the order of less than about 10 nanometers, for instance.

Seals 60 are provided around the periphery of the PV cell module 16 to define space 62, which contains an electrolyte, which serves as a charge carrier for returning electrons from an external circuit. The electrolyte comprises a species that can undergo oxidation-reduction reaction, such as a combination of an iodide salt and iodine, or a bromide salt and bromine. Salts such as LiI, NaI, KI, $CaI_2$, LiBr, NaBr, KBr, or $CaBr_2$ are often used. Seals 60 are made of a material resistant to chemical attack by the electrolyte, such as an epoxy resin.

Each of PV cells in each of the PV cell modules 12, 14 and 16 is electrically connected through its own pair of electrodes to an external circuit to provide electrical power thereto. The interconnection of the PV cells between cell modules 12, 14 and 16 is discussed further below with respect to FIGS. 4-9. Furthermore, each of PV cells may include an electrical control device to provide substantially maximum power, as measured by the product of voltage and current, from the individual cell. Therefore, the PV device 10 can be adjusted to operate at or near its maximum efficiency.

The first substrate 18 of the first PV cell module 12 and the second substrate 54 of the last PV cell module 16 in the stack are preferably coated with barrier coatings that provide a barrier (not shown) to the diffusion of chemically reactive species of the environment into the internal portions of the PV device 10. Among those chemical reactive species are oxygen; water vapor; solvents; acid gases, such as hydrogen sulfide, $SO_x$, $NO_x$, etc., which can attack and degrade the sensitive components of the organic PV device 10, such as the organic dye, the catalyst layer, the electrodes, or the electrolyte.

In one embodiment of the present invention, a barrier coating of the first substrate 18 of the first PV cell module 12 and the second substrate 54 of the last PV cell module 16 in the stack comprises a multilayer stack of a plurality of alternating organic and inorganic layers. A barrier coating also can be one the composition of which varies continuously across its thickness, such as from a predominantly organic composition to a predominantly inorganic composition. The thickness of the barrier coating is in the range from about 10 nm to about 1000 nm, preferably from about 10 nm to about 500 nm, and more preferably from about 10 nm to about 200 nm. It is desirable to choose a coating thickness that does not impede the transmission of light through the substrate that receives light, such as a reduction in light transmission less than about 20 percent, preferably less than about 10 percent, and more preferably less than about 5 percent. The organic layers of the multilayer stack comprises a polymeric material selected from the group consisting of polyacrylates, polyester, polyethyleneterephthalate, polyolefins, and combinations thereof. The organic layers can be deposited as a monomer or oligomer of the final polymer onto a substrate by a method selected from the group consisting of spin coating, dip coating, vacuum deposition, ink-jet printing, and spraying, followed by a polymerization reaction of the monomer or oligomer. The thickness of an organic layer is in the range from about 10 nm to about 500 nm.

The inorganic layers typically comprise oxide; nitride; carbide; boride; or combinations thereof of elements of Groups IIA, IIIA, IVA, VA, VIA, VIIA, IB, and IIB; metals of Groups IIIB, IVB, and VB; and rare-earth metals. For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum tartrate and ammonia. Other combinations of reactants may be chosen to obtain a desired coating composition. The choice of the particular reactants depends on the final composition of the barrier coating. The thickness of an inorganic layer is typically in the range from about 10 nm to about 200 nm, preferably from about 10 nm to about 100 nm. The inorganic layer can be deposited onto a substrate by a method selected from the group consisting of plasma-enhanced chemical-vapor deposition ("PECVD"), radio-frequency plasma-enhanced chemical-vapor deposition ("RFPECVD"), expanding thermal-plasma chemical-vapor deposition ("ETPCVD"), sputtering including reactive sputtering, electron-cyclotron-resonance plasma-enhanced chemical-vapor deposition ("ECRPECVD"), inductively coupled plasma-enhanced chemical-vapor deposition ("ICPECVD"), or combinations thereof.

Figure 2:
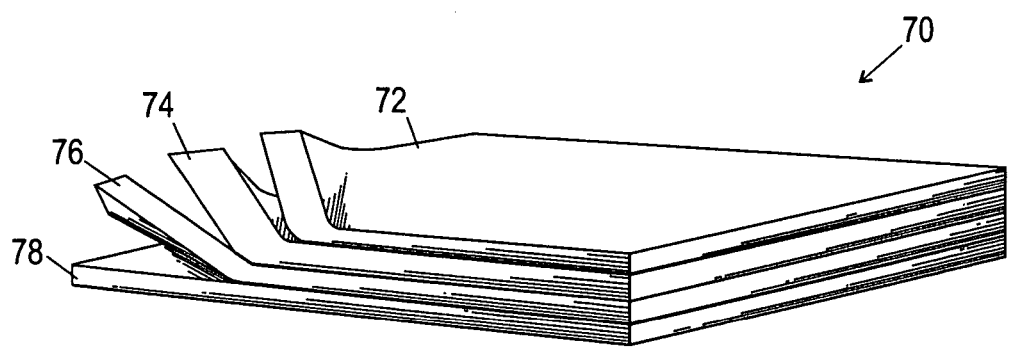
FIG. 2 is a diagrammatic view of a photovoltaic device fabricated in sheets in accordance with embodiments of the present techniques.

As discussed above, the PV device 10 may include a number of PV cells arranged to form PV cell modules which are stacked on top of each other. In one exemplary embodiment, the PV device 10 may be fabricated by forming "sheets" and laminating the sheets together. FIG. 2 illustrates an exemplary embodiment of the PV device 10, generally designated by the reference numeral 70. The PV device 70 generally includes a plurality of sheets 72, 74, 76 and 78. As will be illustrated and discussed further with reference to FIGS. 3-9, each sheet 72-78 comprises a flexible substrate having conductive elements deposited and patterned thereon. As further described below, the elements are configured to form the anodes and cathodes of various photovoltaic cells in the PV device 70.

Each PV cell may be an inorganic thin-film solar cell such as a-Si, CIGS, GaAs and CdTe. Alternatively, each PV cell may be an organic solar cell of different types such as small molecular donor-acceptors, polymeric donor-acceptors, fulerenes-polymer heterojunction, dye-sensitized cells, or hybrid cells having organic materials and inorganic nanomaterials, for example. In one embodiment, the PV device 70 may include a plurality of organic photovoltaic cells configured to absorb photon energy and to convert the absorbed photon energy to electric energy.

Further, while the present embodiment illustrates a PV device 70 comprising a number of sheets 72-78 having elements fabricated thereon, it should be understood that other stacked illumination devices, including luminescence elements, such as organic light emitting devices, or electric storage elements in addition to, or instead of the PV devices, may be fabricated in accordance with the stacked configuration described and illustrated. In accordance with embodiments of the present invention directed to the interconnection of the various layers or sheets, the electrical coupling techniques may also be applicable to a broader range of stacked illumination devices, such as those including luminescence element configured to produce illumination at a desired wavelength, for instance. Furthermore, in accordance with embodiments of the invention the photoelectric device may include any combination of PV devices, illumination devices, electric storage devices (such as batteries), as well as photoelectric sensing devices.

Figure 3:
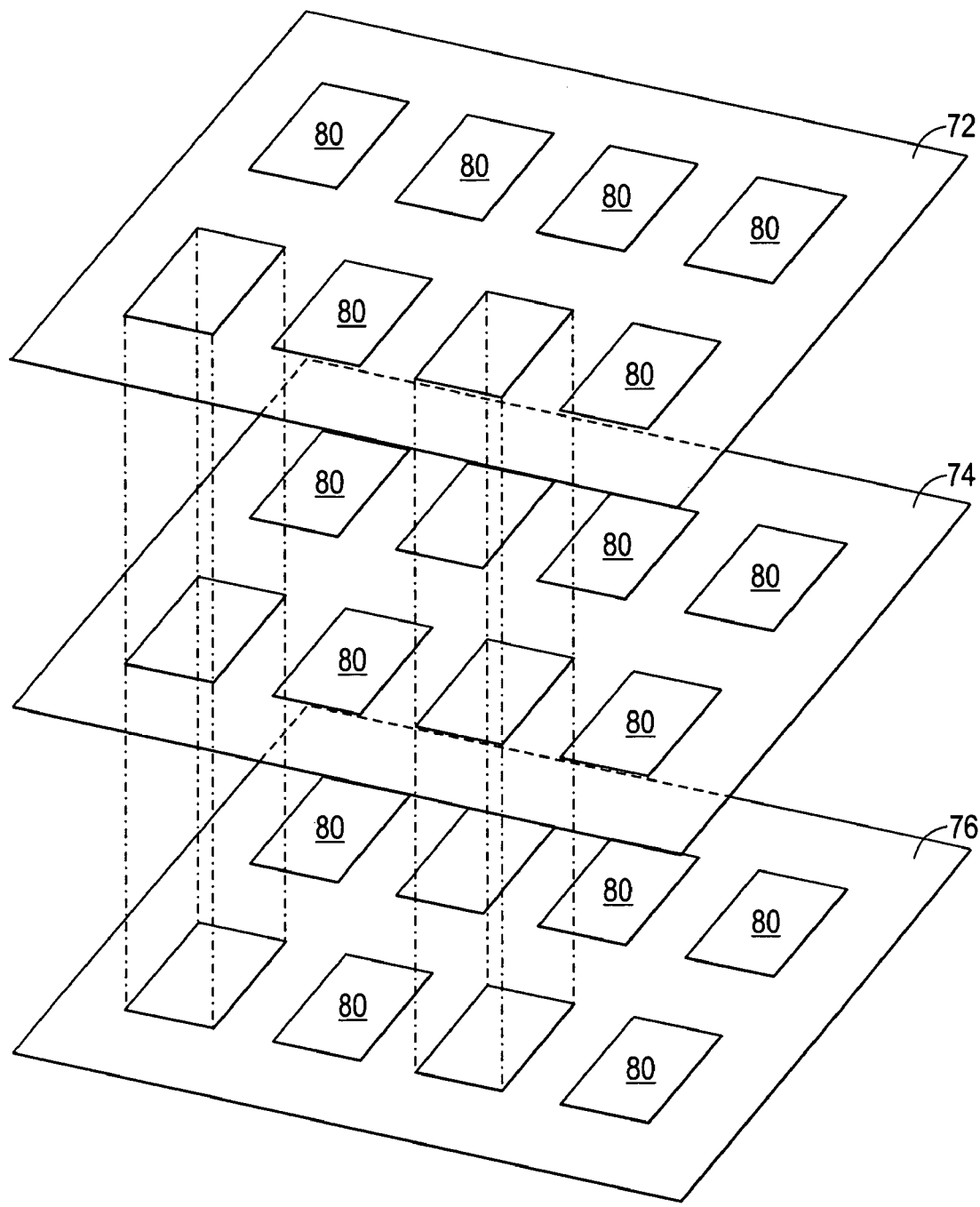
FIG. 3 is an exploded perspective view of sheets which may be fabricated to form a photovoltaic device in accordance with the present techniques.

As previously described with reference to FIG. 1, each PV cell module (e.g., PV cell modules 12, 14 and 16) may include a plurality of PV cells. As discussed above, the substrates have PV cell elements patterned and fabricated thereon and the PV cells are formed by laminating the substrates together to form the PV cells between the substrates, thus forming a PV device. Once the PV cell elements are formed on the substrates, they may be laminated together to form the stacked structures illustrated in FIGS. 1 and 2. FIG. 3 illustrates an exploded perspective view of the sheets 72, 74 and 76 (FIG. 2) to illustrate the arrangement of the PV elements and cells with relation to one another. The arrangement and interconnection of the various elements will be described further with reference to FIGS. 4-9.

As illustrated in FIG. 3, each layer or sheet 72, 74 and 76 includes a substrate having PV cell elements patterned thereon in desired locations 80. The PV cell elements may include materials such as conductive layers configured to the form anodes and cathodes of the PV cell, semiconductor materials and catalysts. Further, an electrolyte material may be disposed on or between the substrates. As discussed with reference to FIG. 1, each anode/cathode pair may be fabricated on adjacent substrates. As previously described, the semiconductor materials, catalysts and an electrolyte material are also disposed on or between the substrates. As will be appreciated, the locations 80 are provided for illustrative purposes and do not necessarily coincide with a particular element of the PV cell. Rather, the locations 80 simply demarcate the locations of the various PV cells rather than the boundaries of each of the PV cell elements. As illustrated in FIG. 3, the locations 80 are defined such that the PV cells are disposed directly on top of each other or such that they substantially overlap from a top perspective view. The overlapping PV cells from one PV cell module to the next comprise photoactivatable dyes that have strong absorption of light in different wavelength ranges of the spectrum of light received by PV device so that substantially all of the received light may be harvested. Preferably, all PV cells in a single module (i.e., each of the PV cells formed on a single layer between two particular substrates) are provided with one type of photoactivatable dye. Each of the PV cells of a PV cell module are electrically connected (e.g., in parallel, in series, or a combination thereof) such that a desired voltage, current, or power (as measured by the product of voltage and current) is achieved, as discussed further below.

Figure 4:
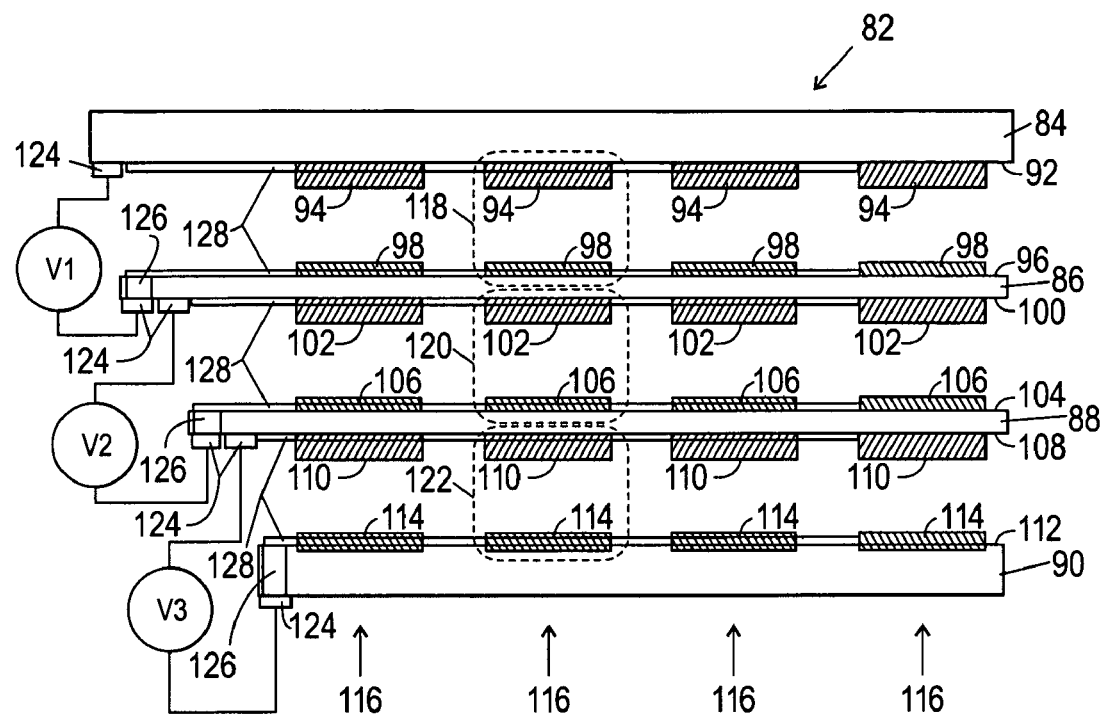
FIG. 4 is a cross-sectional view of a photovoltaic device having interconnects fabricated in accordance with embodiments of the present techniques.

Referring now to FIG. 4, a PV device 82 fabricated in accordance with embodiments of the present invention is illustrated. The PV device 82 includes a plurality of substantially transparent, flexible substrates 84, 86, 88 and 90. Each of the flexible substrates 84-90 may comprise a material and may have the properties previously described with reference to the substrates 18, 26, 40 and 54 of FIG. 1. Each of the substrates 84-90 are patterned to form PV cell elements that will eventually form PV cells once the substrates are laminated together. Accordingly, at least one surface of each of the plurality of substrates 84-90 includes one or more elements or layers that make up a PV cell such that stacked PV cells are formed when the layers are laminated together. For instance, the lower surface 92 of the substrate 84 includes a plurality of elements 94. Each of the elements 94 may include a conductive coating, such as ITO, that is configured to provide an anode for a respective PV cell. As previously described with respect to FIG. 1, a semiconductor layer may be disposed on each of the anodes. Accordingly, in the present exemplary embodiment, each of the elements 94 includes an anode having a semiconductor layer disposed thereon. Alternatively, the lower surface 92 of the substrate 84 may be coated with a conductive material, such as ITO. In this embodiment, the elements 94 may include only the semiconductor material (previously described) that is patterned to provide the boundaries of respective PV cells.

The counter-electrodes, here cathodes, for the first layer of PV cells may be fabricated on the second substrate 86. Accordingly, the upper surface 96 of the second substrate 86 includes a number of elements 98 configured to align with the elements 94. Each of the elements 98 may include a conductive coating having a catalyst material for oxidation-reduction reaction disposed thereon. Alternatively, the upper surface 96 of the substrate 86 may be coated with a conductive material, such as ITO. In this embodiment, the elements 98 may include only the catalyst material (previously described) that is patterned to provide the boundaries of respective PV cells. As will be appreciated, a charge carrying material such as an electrolyte material (not shown) may be disposed between each of the elements 94 and 98 to complete the plurality of PV cells.

To provide a PV device 82 configured to absorb light at different wave lengths, a second set of solar cells may be formed between the second substrate 86 and the third substrate 88. Accordingly, the lower surface of 100 of the substrate 86 includes a plurality of elements 102. Each of the plurality of elements 102 may include a conductive coating configured to form anodes of respective PV cells. The conductive coating may include a layer of semiconductor material disposed thereon, such that each of the elements 102 has a similar configuration to that of the elements 94. Similarly, the upper surface 104 of the substrate 88 may include a number of elements 106 having a similar configuration to that of the elements 98. Accordingly, each of the elements 106 may include a catalyst material disposed on a conductive coating configured to form the cathode of the respective solar cell. As will be appreciated, a charge carrying material such as an electrolyte (not shown) is generally disposed between the second substrate 86 and the third substrate 88.

The lower surface 108 of the substrate 88 may include a number of elements 110 having a configuration similar to that of the elements 94 and 102. That is to say, each of the elements 110 may include a conductive material configured to form the anode of a respective solar cell and a semiconductor layer disposed thereon. Finally, the upper surface 112 of the substrate 90 includes a number of elements 114. Each of the elements 114 may comprise a conductive coating configured to form a cathode of a respective PV cell and a catalyst material disposed thereon. As will be appreciated, a charge carrying material such as an electrolyte (not shown) is generally disposed between the third substrate 88 and the fourth substrate 90.

As previously described, once the substrates 84-90 are laminated together to form the PV device 82, vertical stacks 116 of PV cells are formed. Each anode/cathode pair, along with the semiconductor, catalyst, and electrolyte materials, forms a respective PV cell. Thus, a layer or module of PV cells are formed between each of the substrates 84, 86, 88 and 90. For example, in the present exemplary embodiment, each stack 116 includes three PV cells 118, 120 and 122, indicated by dashed lines. To provide optimal light absorption for each of the stacks in the PV device 82, each of the cells 118, 120 and 122 may include different photoactivatable dyes chosen to have substantial absorption in different ranges of the light spectrum.

To operate the various PV cells 118, 120 and 122, different supply voltages may be advantageously derived. Accordingly, a first voltage source V1 may be derived to obtain power from the first layer of solar cells 118 of each stack 116. A second voltage source V2 is formed from the second layer of solar cells 120 of each stack 116. A third voltage source V3 may be derived to obtain power from a third layer of solar cells 122 of the stack 116.

To facilitate the interconnection and use of the voltage sources V1, V2 and V3, the substrates 84-90 are configured to form a stepped structure. The stepped structure is formed such that an edge portion of each of the substrates 84-90 is accessible for connection to one or more of the voltage sources V1, V2 and V3. The contacts pads on the steps include clearance to isolate the interconnections between the top and the bottom conductive layers of the substrate. To create the stepped structure, each successive substrate in the stacked PV device 82 is slightly longer than the last, thereby providing an exposed edge portion. That is to say that the substrate 88 is slightly longer than the substrate 90, the substrate 86 is slightly longer than the substrate 88 and the substrate 84 is slightly longer than the substrate 86, as illustrated in FIG. 4. Once the substrates 84-90 are laminated together to form the PV device 82, the edge portions of the substrates 84-90 form a step pattern.

To obtain power from the various PV cells (e.g., PV cells 118, 120 and 122), interconnects are formed on the edge portion of each of the plurality of substrates 84-90. In accordance with the exemplary embodiment illustrated in FIG. 4, the interconnects include conductive pads 124 disposed on the lower surfaces of the edge portion of each of the substrates to facilitate connection of the conductive pads 124 to the voltages sources V1, V2 and V3. In the present exemplary embodiment, the interconnects also include electrically conductive vias formed through the substrates, as described further below.

As will be illustrated further with respect to FIGS. 6-9, each substrate 84-90 includes conductive pads 124 which may be coupled to produce respective voltage supplies, such as the voltage sources V1, V2 and V3. Further, in accordance with the present exemplary embodiment, to provide electrical connections from one side of a substrate to the other (here the lower surface of each substrate to the upper surface of the substrate), electrical vias 126 may be formed through the substrates 86, 88 and 90. The electrical vias may be formed by a laser or by a chemical drilling technique, for instance. Each of the vias 126 is electroplated to form a conductive path from one surface (lower) of a substrate to the other (upper). Further, and as illustrated best with respect to FIGS. 6-8, electrical buses comprising a electrically conductive traces 128 are patterned on the surfaces of the substrates to provide electrical paths between each of the corresponding anodes and cathodes of each of the PV cells.

Advantageously, the presently described interconnection provides a PV device 82 that is lighter, more flexible, cheaper, more robust and easier to manufacture than prior interconnection techniques. As will be appreciated, among the advantages of current one-sided interconnect designs are the flexibility for voltage or current matching for different cell modules, as well as simplified device fabrication. Current thin-film type tandem cells generally require exact current matching among the various cell modules in the stack. As such, the cell modules are generally fabricated in a vacuum chamber for precise material deposition. In contrast, in accordance with the present techniques, such processing restrictions are not necessary. When a desired device is needed, selected modules can be stacked together and the interconnects may be implemented such that each cell module will have either the same voltage or current for maximum device efficiency. Because each module has all interconnects on one side of the device, the device can be fabricated first. Each cell module or sheet may be tested separately before being coupled to another cell module. After the module is fabricated, the interconnects may be formed. Based at least partially on the test characteristics of each cell module, the particular interconnect structure for connecting one module to the next may be selected to provide optimal current/voltage matching.

Figure 5:
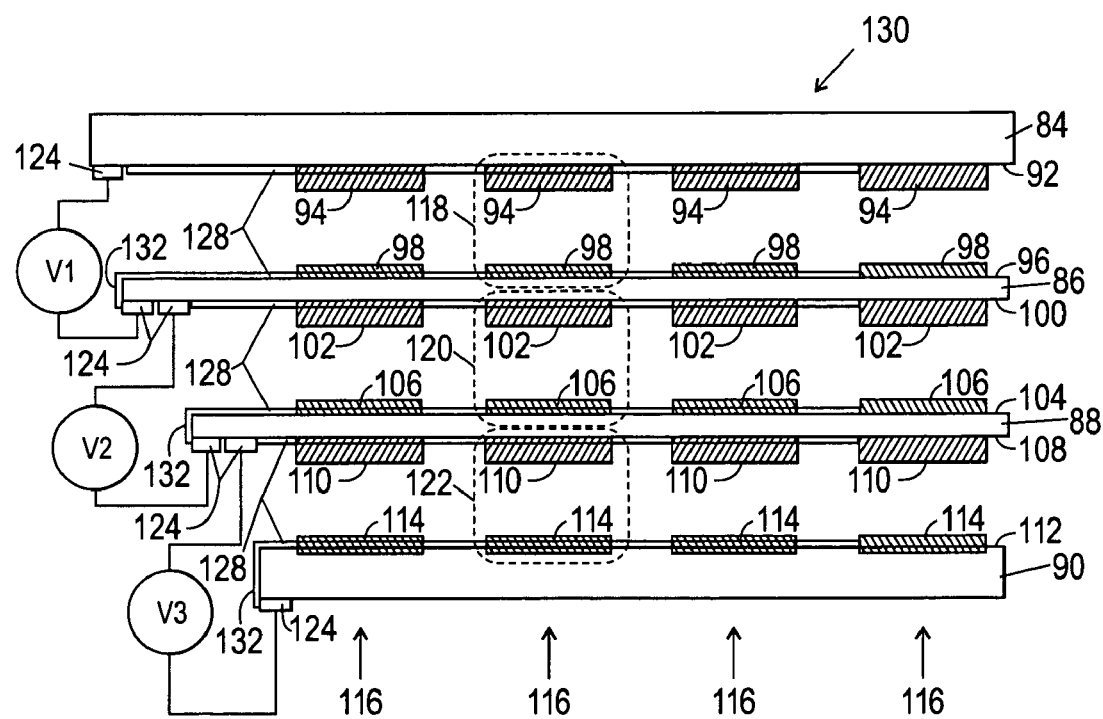
FIG. 5 is a cross-sectional view of another photovoltaic device having interconnects fabricated in accordance with alternative embodiments of the present techniques.

FIG. 5 illustrates an alternate exemplary embodiment of a PV device 130 fabricated in accordance with alternate embodiments of the present techniques. Each of the common elements previously described with respect to FIG. 4 is illustrated in FIG. 5. The difference in the PV cell 130 of FIG. 5 (compared to the PV cell 82 of FIG. 4) is in the interconnect structure for electrically interconnecting one side/surface of a substrate to another. Rather than implementing the vias 126, as illustrated in the PV device 82, the edges of each of these substrates 86, 88 and 90 are electroplated. That is to say, a conductive coating 132 is provided such that each of the conductive buses or traces 128 on one side of the substrate are coupled to the conductive pads 124 on the opposing side of the substrate. As will be appreciated, rather than drilling vias through the edge of the substrates and forming an electrical path from one side of a respective substrate to the opposing side through the electrically conductive via, the path is simply formed around the edge via the conductive edge wrap material 132. Advantageously, a device, such as the PV device 130 may be cheaper to fabricate using edge raps, as compared to vias.

Figure 6:
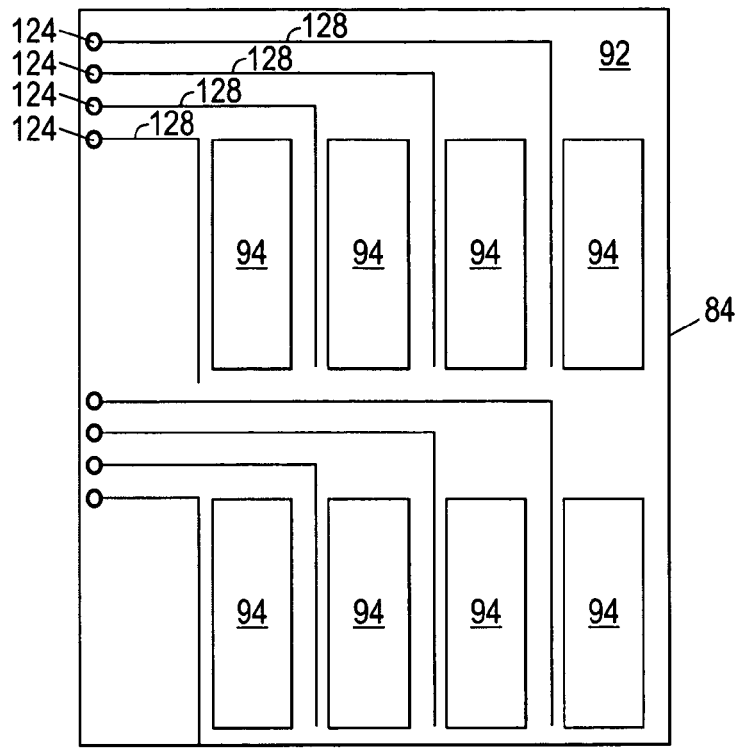
FIGS. 6-9 illustrate top views of the various layers of the photovoltaic devices illustrated in FIGS. 4 and 5.
Figure 7:
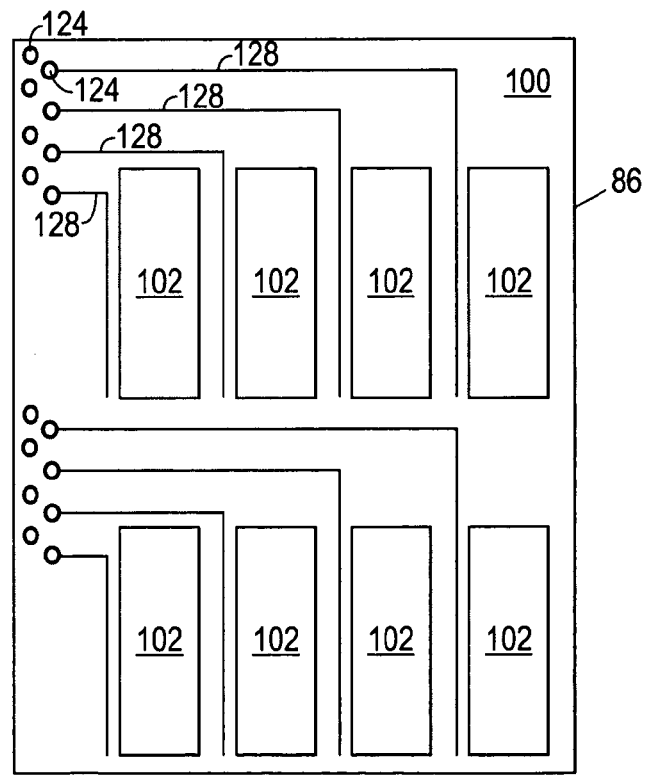
Figure 8:
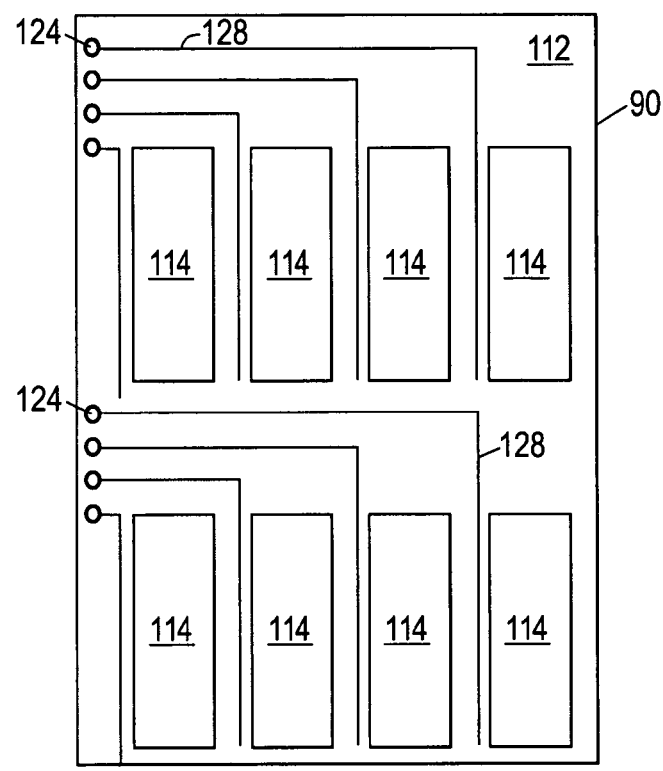
Figure 9:
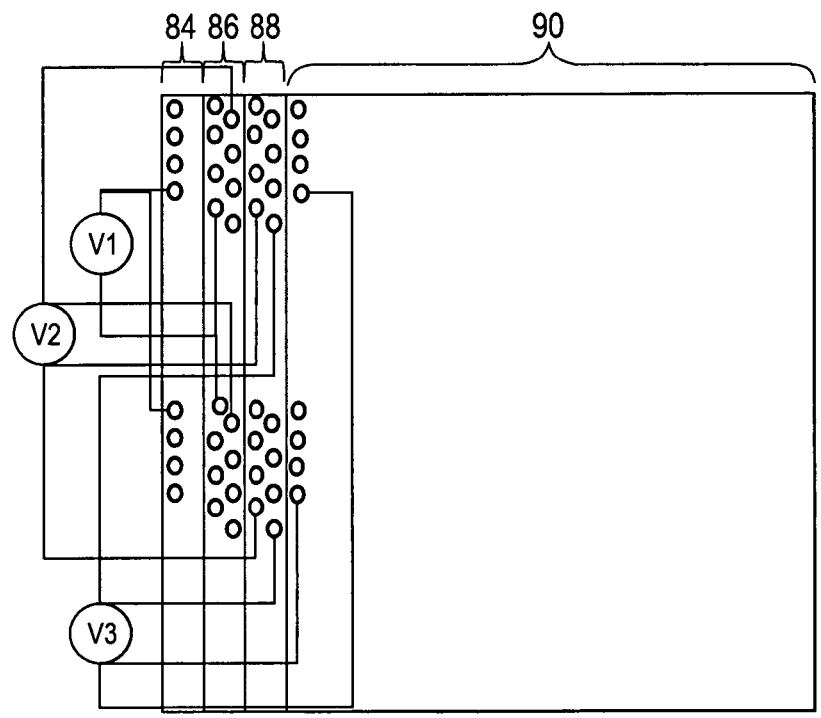

FIGS. 6-9 provide various views of the exemplary interconnect structures described above with reference to FIGS. 4 and 5. No new elements are indicated. FIGS. 6-9 are simply provided to better illustrate certain of the features of the present embodiments. Specifically, FIG. 6 illustrates a top view of the lower surface 92 of the substrate 84. As indicated in FIGS. 4, 5 and 6, conductive pads 124 are electrically routed to each of the PV elements 94 via the conductive traces 128. FIG. 7 illustrates a top view of an intermediate substrate (i.e., not one of the outer substrates 84 or 90), such as the substrates 86 and 88. For instance, FIG. 7 illustrates the lower surface 100 of the substrate 86. As indicated in FIGS. 4, 5 and 7, each of the conductive pads 124 in the inner column of conductive pads 124 is electrically routed to each of the PV elements 102 via the conductive traces 128. As best illustrated in FIGS. 4 and 5, the outer column of conductive pads 124 is coupled to the upper surface 96 of the substrate 86 through the via 126 or edge wrap 132. FIG. 8 illustrates a top view of the upper surface 112 of the substrate 90. As indicated in FIGS. 4, 5 and 8, conductive pads 124 are electrically routed to each of the PV elements 114 via the conductive traces 128. The conductive pads 124 receive voltage from the voltage sources V1, V2 and V3 through vias 126 or edge wraps 132 configured to route the voltage from the lower surface of the substrate 90 to the upper surface 112. Finally, FIG. 9 is a top view of the backside of the PV device 82 after the structure has been laminated to form the stack.

The interconnection concept described in the present specification allows for flex based, or other high density electronics, to be tightly interconnected to the PV device, OLED, battery, or combination of such flexible structures as described herein. Advantageously, this interconnect strategy also allows for adding electronics that can perform a wide range of functions such as power switching, peak power control, voltage regulation, timing/sequencing, and communications. These functions can accomplish local, global or a combination of the functions so as to optimize and perhaps synchronize the operation of the overall system. As will be appreciated, embodiments of the present invention may be implemented in systems that can be self standing such as self powering signs, remote power generator/harvesting, energy storage, and remote communication systems, for example.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A photovoltaic device comprising:
a plurality of substrates arranged in a stack;
one or more photovoltaic cells formed between pairs of substrates among the plurality of substrates; and
wherein each of the plurality of substrates comprises a plurality of interconnects configured to provide voltage on each side of each of the plurality of substrates.

2. The photovoltaic device, as set forth in claim 1, wherein each of the plurality of substrates comprises a flexible substrate.

3. The photovoltaic device, as set forth in claim 1, wherein each of the plurality of interconnects comprises a conductive pad on each side of each of the plurality of substrates and further comprises a via disposed through the substrate to electrically couple the respective conductive pads on each side of the plurality of substrates.

4. The photovoltaic device, as set forth in claim 1, wherein each of the plurality of interconnects comprises a conductive strip configured to wrap around the edge of each of the substrates.

5. The photovoltaic device, as set forth in claim 1, wherein each of the plurality of substrates in the stack comprises at least one edge portion that extends beyond the edge portion of the immediately adjacent substrate, such that the edge portions form a step pattern.

6. The photovoltaic device, as set forth in claim 5, wherein each of the plurality of interconnects is formed in the edge portion of each of the plurality of substrates.

7. An electronic device comprising:
a plurality of flexible substrates arranged in a stack and having interconnects, wherein each of the interconnects is configured to derive one of a plurality of voltages on a first side of the plurality of flexible substrates and configured to distribute the one of the plurality of voltages to a respective second side of the plurality of flexible substrates; and
a plurality of electronic cells disposed between pairs of flexible substrates among the plurality of flexible substrates.

8. The electronic device, as set forth in claim 7, comprising a plurality of derived voltage supplies coupled to the electronic device, wherein each of the plurality of voltage supplies is configured to provide one of the plurality of voltages.

9. The electronic device, as set forth in claim 7, wherein each of the plurality of voltages comprises a different voltage level.

10. The electronic device, as set forth in claim 7, wherein each of the plurality of electronic cells comprises an organic electronic cell.

11. The electronic device, as set forth in claim 7, wherein each of the plurality of electronic cells comprises a photovoltaic cell.

12. The electronic device, as set forth in claim 7, wherein the plurality of flexible substrates comprises a first, second and third flexible substrate, and wherein a first layer of the plurality of electronic cells is formed between the first and second flexible substrates and wherein a second layer of the plurality of electronic cells is formed between the second and third flexible substrates.

13. The electronic device, as set forth in claim 12, wherein the first layer of the plurality of electronic cells is configured to derive a first of the plurality of voltages and the second layer of the plurality of electronic cells is configured to derive a second of the plurality of voltages.

14. A photovoltaic device comprising:
an upper substrate having a top surface and a bottom surface and having a first plurality of active elements disposed on the bottom surface of the upper substrate;
a lower substrate having a top surface and a bottom surface and having a second plurality of active elements disposed on the top surface of the lower substrate; and
at least one intermediate substrate disposed between the upper and lower substrate and having a top surface and a bottom surface, wherein a third plurality of active elements are disposed on the top surface of the at least one intermediate substrate and a fourth plurality of active elements are disposed on the bottom surface of the at least one intermediate substrate, and
wherein the at least one intermediate substrate comprises a plurality of interconnects configured to distribute a voltage from the top surface to the bottom surface of the at least one intermediate substrate.

15. The photovoltaic device, as set forth in claim 14, wherein each of the plurality of interconnects comprises a conductive via.

16. The photovoltaic device, as set forth in claim 14, wherein each of the plurality of interconnects comprises a conductive edge wrap.

17. The photovoltaic device, as set forth in claim 14, wherein the bottom surface of the at least one intermediate substrate comprises:
a first plurality of pads coupled to the interconnects and configured to obtain a first voltage from the upper surface of the at least one intermediate substrate; and
a second plurality of pads configured to obtain a second voltage, and wherein the second voltage is not provided to the upper surface of the at least one intermediate substrate.

18. The photovoltaic device, as set forth in claim 14, wherein:
- each of the first plurality of active elements comprises one of an anode or a cathode of a first photovoltaic cell;
- each of the third plurality of active elements comprises the other of the anode or the cathode of the first photovoltaic cell;
- each of the fourth plurality of active elements comprises one of an anode or a cathode of a second photovoltaic cell arranged directly below the first photovoltaic cell; and
- each of the second plurality of active elements comprises the other of the anode or the cathode of the second photovoltaic cell.

* * * * *